(12) United States Patent
Ahn et al.

(10) Patent No.: US 12,191,181 B2
(45) Date of Patent: Jan. 7, 2025

(54) INTERFACE APPARATUS AND CONTAINER TRANSPORTING SYSTEM WITH THE APPARATUS

(71) Applicant: SEMES Co., Ltd., Chungcheongnam-do (KR)

(72) Inventors: Jun Sang Ahn, Gyeonggi-do (KR); Bo Seung Hwang, Gyeonggi-do (KR); Jeong Ung Cheon, Gyeonggi-do (KR)

(73) Assignee: SEMES Co., Ltd., Chungcheongnam-do (KR)

( * ) Notice: Subject to any disclaimer, the term of this patent is extended or adjusted under 35 U.S.C. 154(b) by 189 days.

(21) Appl. No.: 17/490,011

(22) Filed: Sep. 30, 2021

(65) Prior Publication Data
US 2022/0139750 A1    May 5, 2022

(30) Foreign Application Priority Data
Nov. 4, 2020   (KR) .......................... 10-2020-0146066

(51) Int. Cl.
*H01L 21/677* (2006.01)
*B65G 1/04* (2006.01)
*B65G 47/61* (2006.01)

(52) U.S. Cl.
CPC ...... *H01L 21/67733* (2013.01); *B65G 1/0457* (2013.01); *B65G 1/0485* (2013.01);
(Continued)

(58) Field of Classification Search
CPC .... B65G 1/0457; B65G 1/0485; B65G 47/61; B65G 2201/0297; H01L 21/6773; H01L 21/67733
See application file for complete search history.

(56) References Cited

U.S. PATENT DOCUMENTS

| 5,536,128 A * | 7/1996 | Shimoyashiro ... H01L 21/67161 414/217 |
| 6,308,818 B1 * | 10/2001 | Bonora .................. B65G 37/02 198/465.1 |

(Continued)

FOREIGN PATENT DOCUMENTS

| JP | 2010058942 A | 3/2010 |
| JP | 2010126301 A | 6/2010 |

(Continued)

OTHER PUBLICATIONS

Japanese Decision of Refusal for Japanese Application No. 2021-142118, dated Apr. 25, 2023 with translation, 6 pages.
(Continued)

*Primary Examiner* — Saul Rodriguez
*Assistant Examiner* — Brendan P Tighe
(74) *Attorney, Agent, or Firm* — Buchanan Ingersoll & Rooney PC

(57) ABSTRACT

Provided are an interface apparatus for resolving congestion through a non-stop interface between a transporting device and a logistics automation storage device, and a container transporting system having the same. The interface apparatus includes a saddle for receiving a container from a container transporting device; and a circulating path for providing a route for transporting the container seated on the
(Continued)

saddle to a container storage device, wherein the saddle receives the container while moving together with the container transporting device.

20 Claims, 12 Drawing Sheets

(52) U.S. Cl.
CPC .......... *B65G 47/61* (2013.01); *H01L 21/6773* (2013.01); *B65G 2201/0297* (2013.01)

(56) References Cited

U.S. PATENT DOCUMENTS

| | | | |
|---|---|---|---|
| 7,032,739 B2* | 4/2006 | Tanaka | H01L 21/67727 198/465.1 |
| 7,108,121 B2* | 9/2006 | Fujimura | H01L 21/68707 198/347.1 |
| 7,165,927 B2 | 1/2007 | Doherty et al. | |
| 7,771,153 B2 | 8/2010 | Doherty et al. | |
| 8,197,172 B2 | 6/2012 | Doherty et al. | |
| 9,558,978 B2 | 1/2017 | Widmann et al. | |
| 9,620,397 B2 | 4/2017 | Doherty et al. | |
| 9,881,823 B2 | 1/2018 | Doherty et al. | |
| 10,141,212 B2 | 11/2018 | Doherty et al. | |
| 10,147,627 B2 | 12/2018 | Doherty et al. | |
| 10,381,251 B2 | 8/2019 | Doherty et al. | |
| 2003/0235486 A1 | 12/2003 | Doherty et al. | |
| 2007/0081879 A1* | 4/2007 | Bonora | H01L 21/67733 414/217 |
| 2010/0290872 A1* | 11/2010 | Bonora | H01L 21/67769 257/E21.001 |
| 2010/0290873 A1* | 11/2010 | Bonora | H01L 21/67769 414/225.01 |

FOREIGN PATENT DOCUMENTS

| | | |
|---|---|---|
| JP | 2011077134 A | 4/2011 |
| JP | 5344366 B2 * | 11/2013 |
| KR | 20080055140 A | 6/2008 |
| KR | 20100113625 A | 10/2010 |
| KR | 2015-0013691 A | 2/2015 |
| KR | 20160080708 A | 7/2016 |
| WO | 2009098650 A1 | 2/2009 |

OTHER PUBLICATIONS

Korean Request for the Submission of an Opinion for Korean Application No. 10-2020-0146066, dated Mar. 9, 2023 with translation, 14 pages.
Korean Request for the Submission of an Opinion for Korean Application No. 10-2020-0146066, dated Sep. 20, 2022, with translation, 13 pages.

* cited by examiner

[FIG. 1]
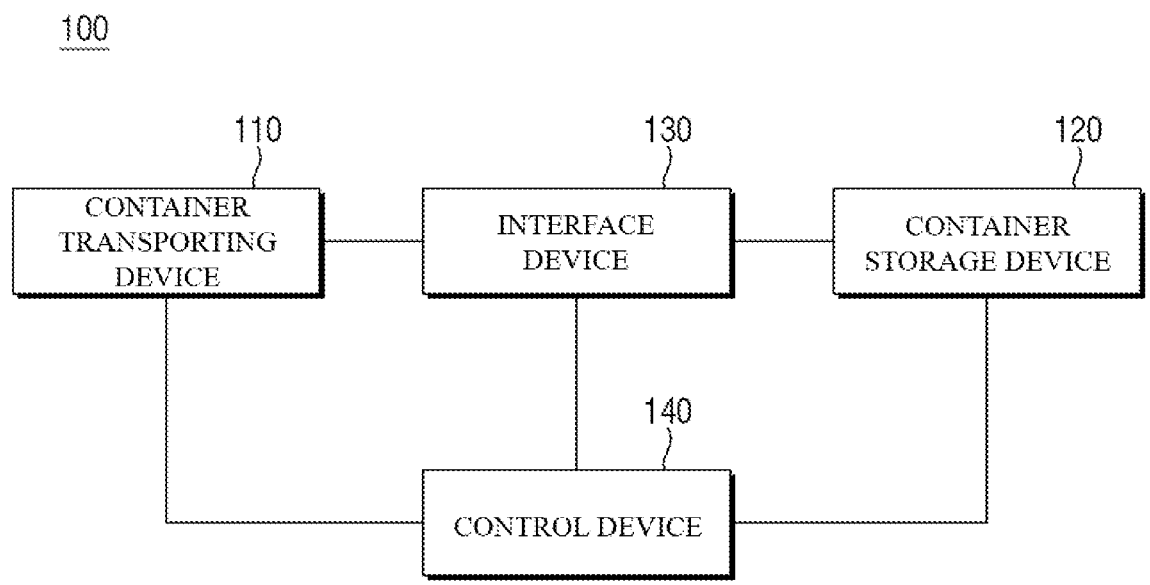

[FIG. 2]
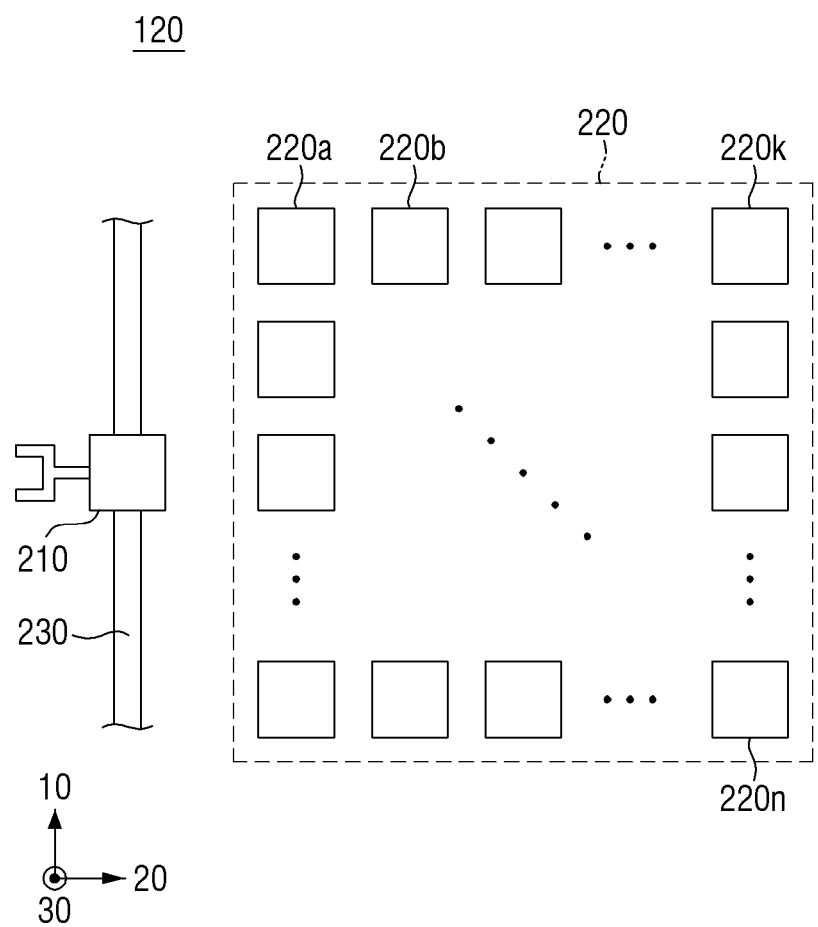

[FIG. 3]
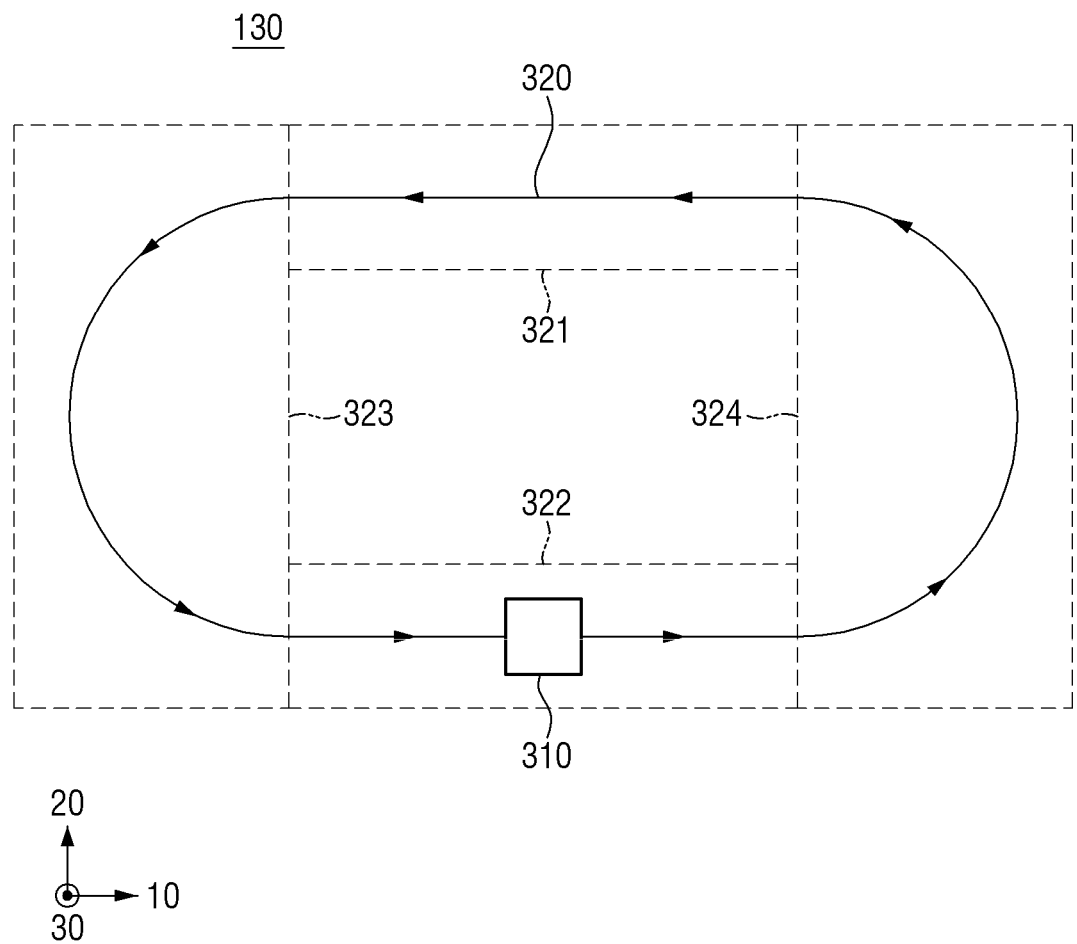

[FIG. 4]
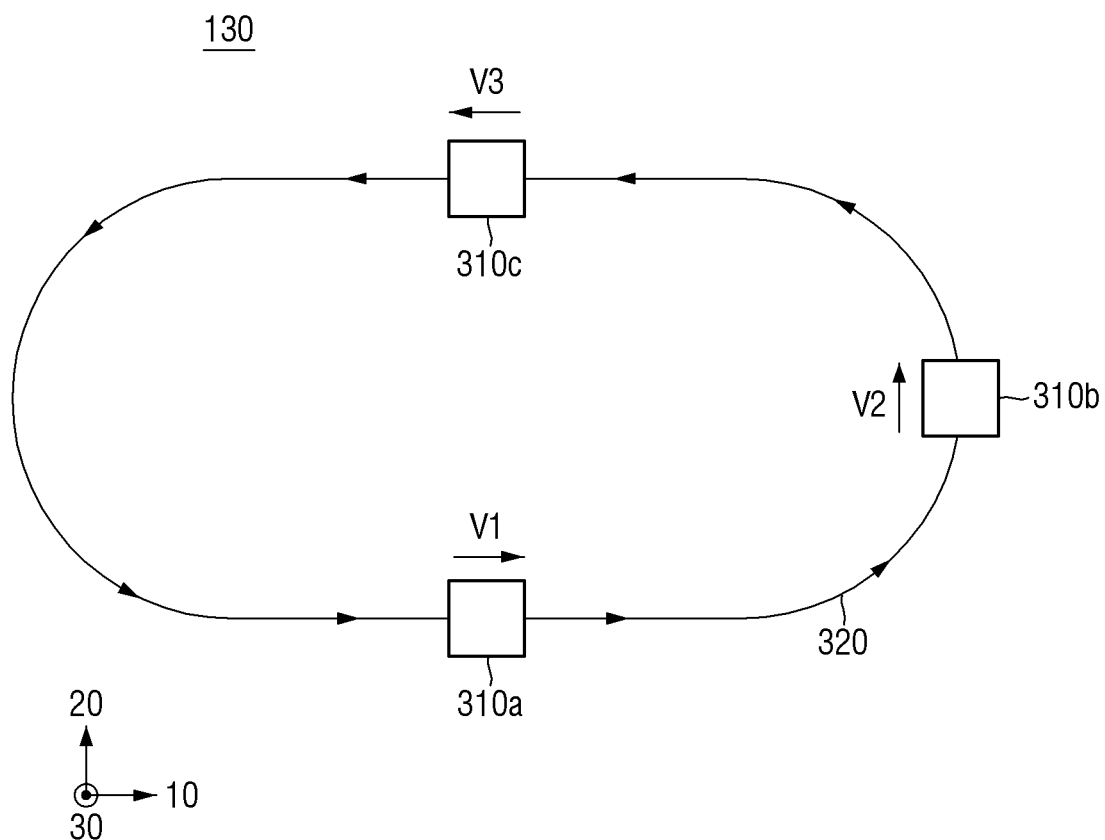

[FIG. 5]
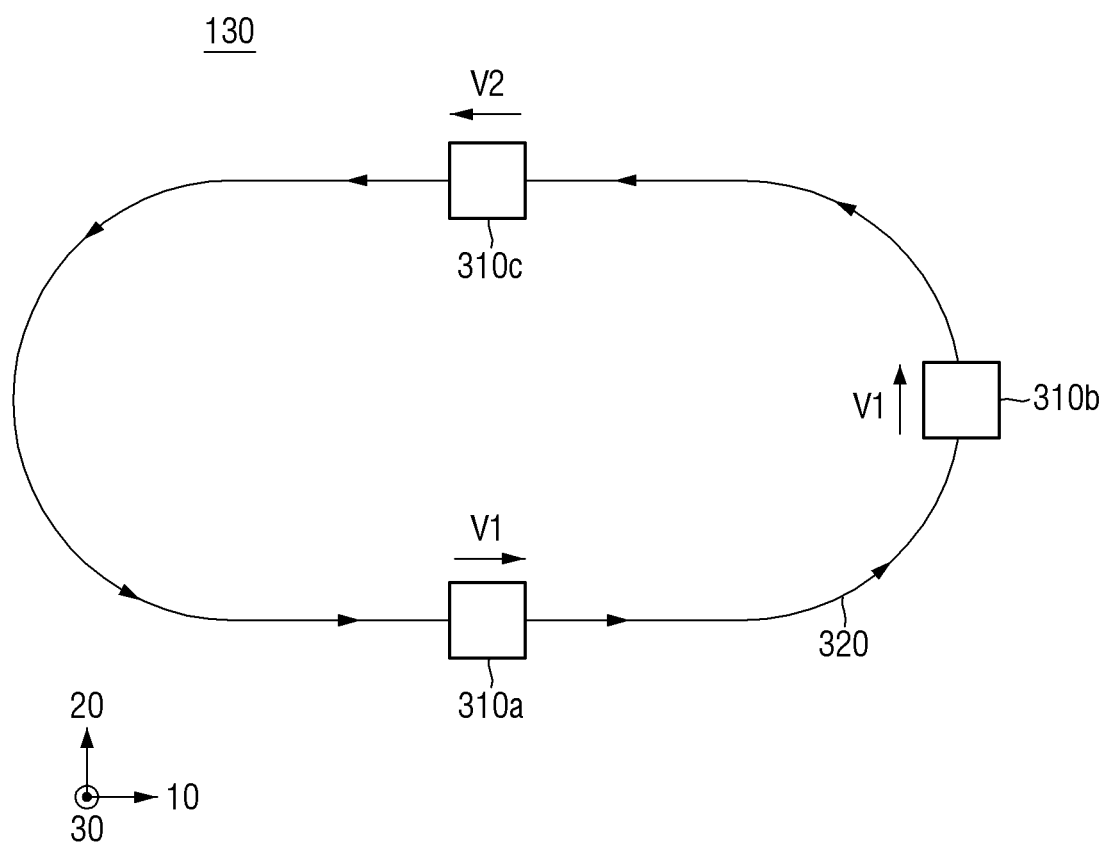

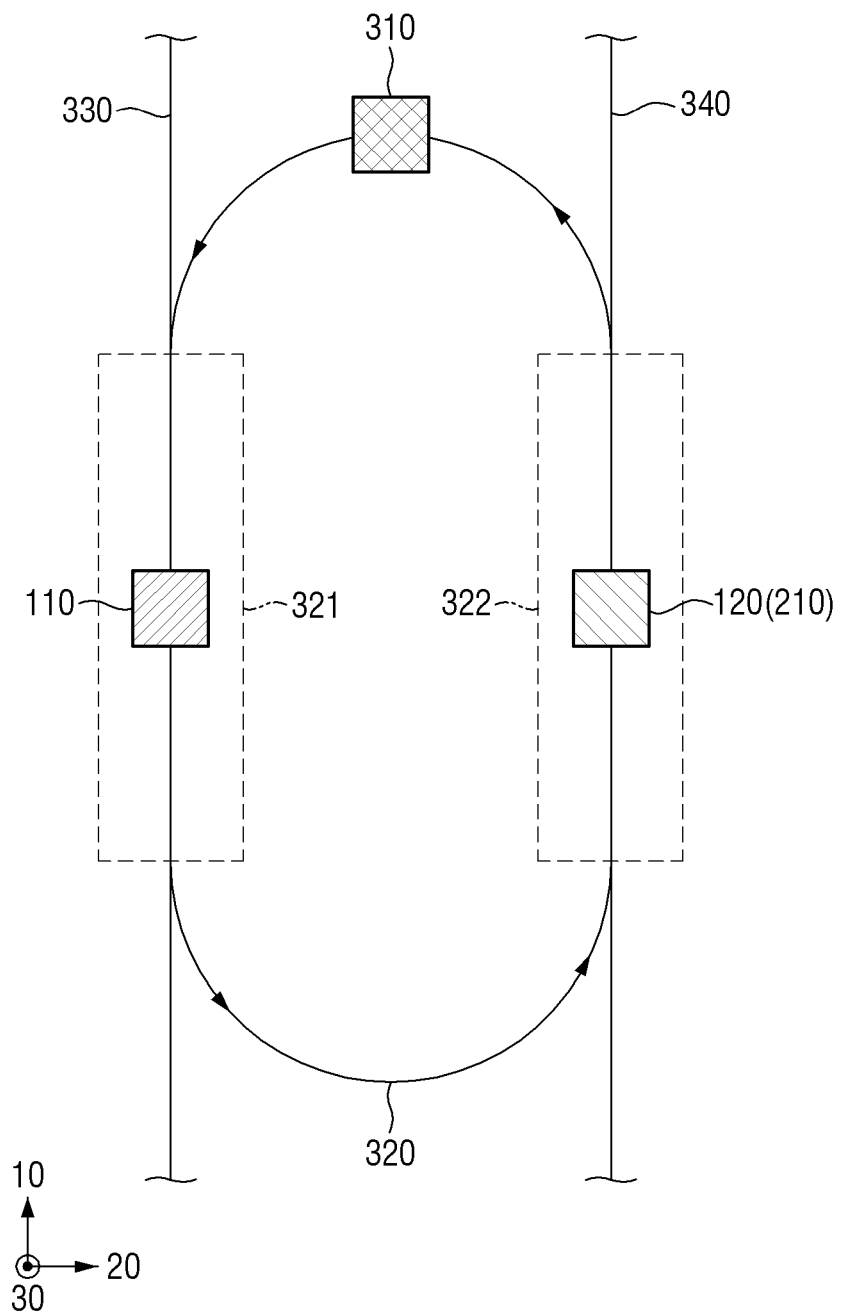
[FIG. 6]

[FIG. 7]
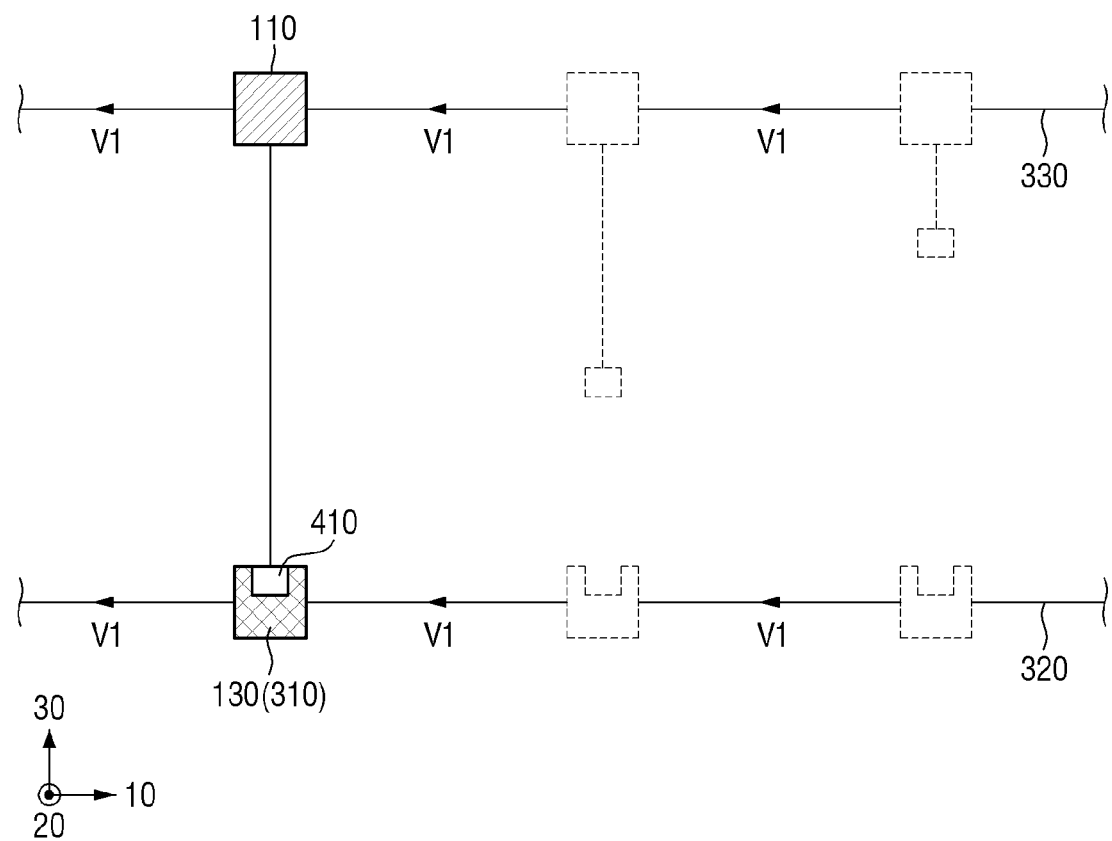

[FIG. 8]
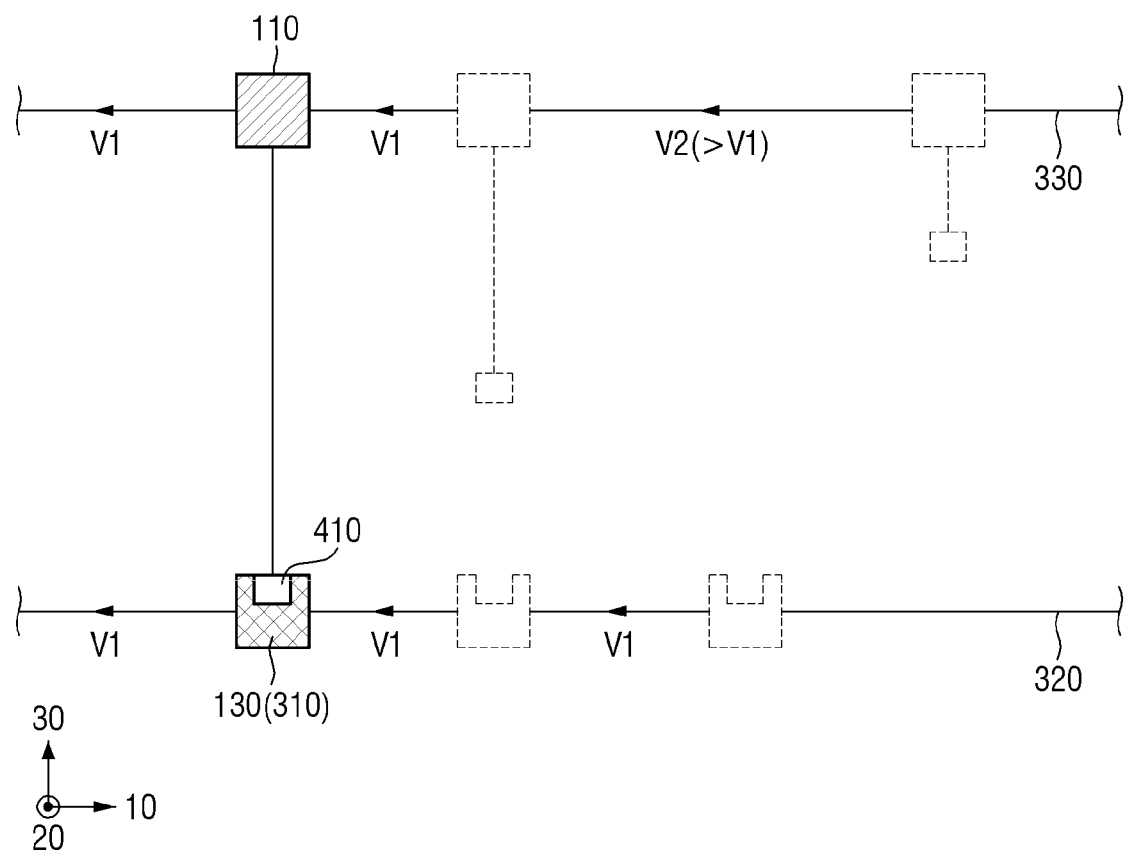

[FIG. 9]
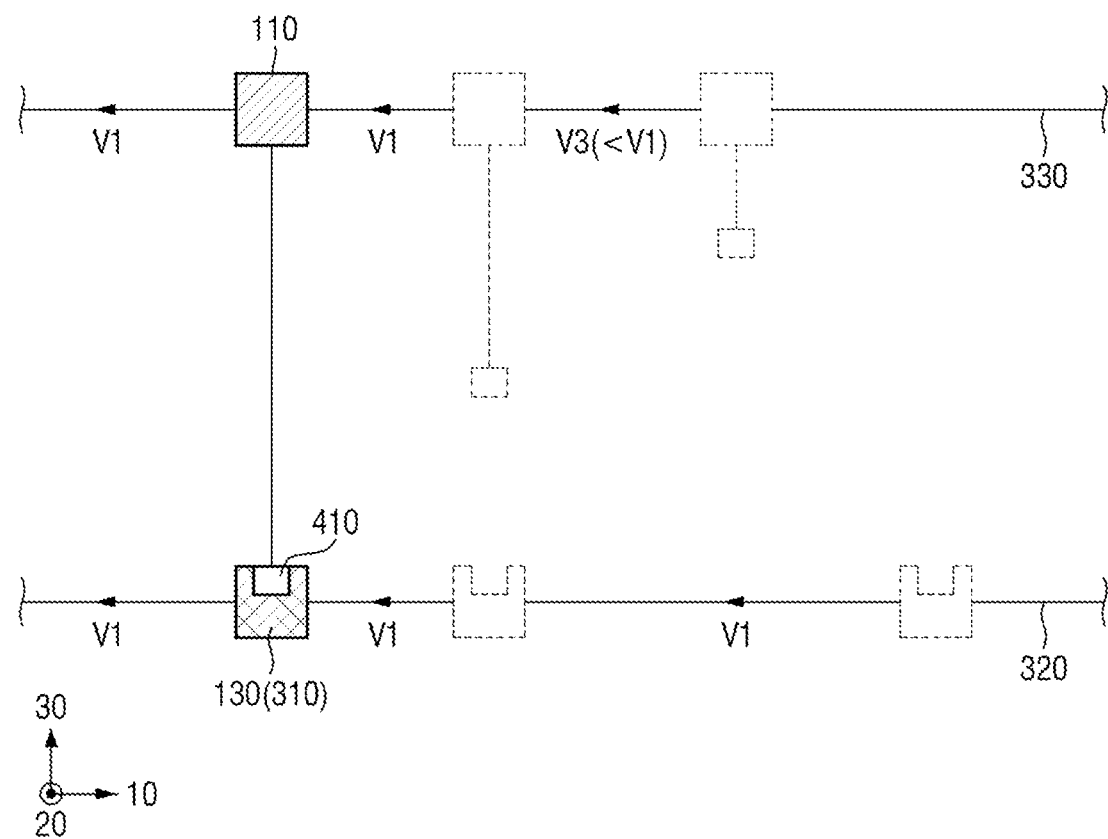

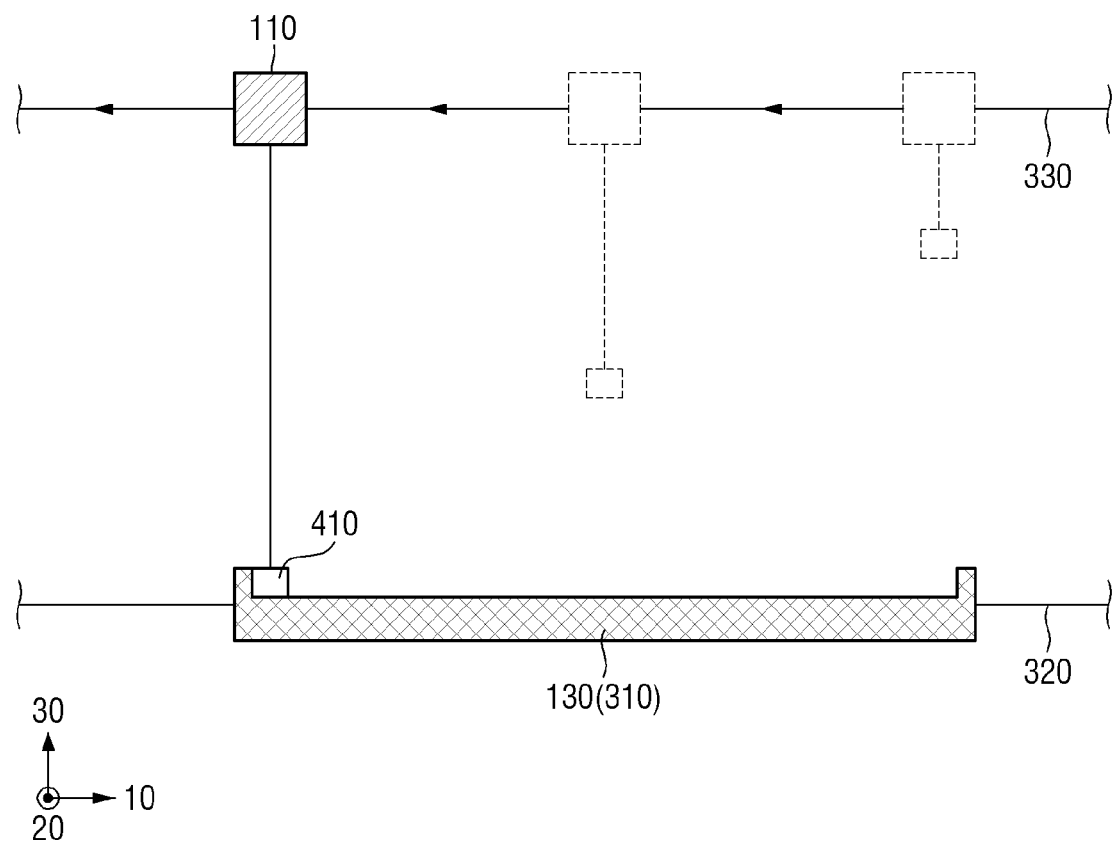
[FIG. 10]

[FIG. 11]
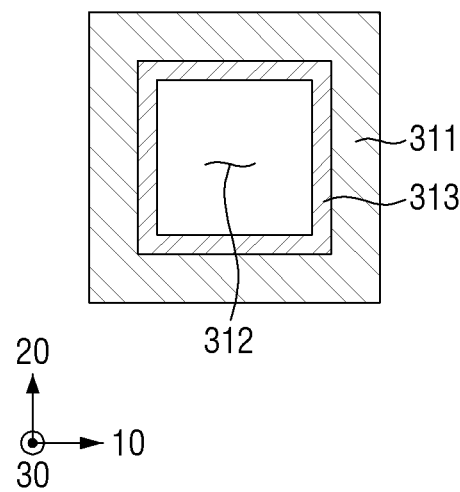
[FIG. 12]
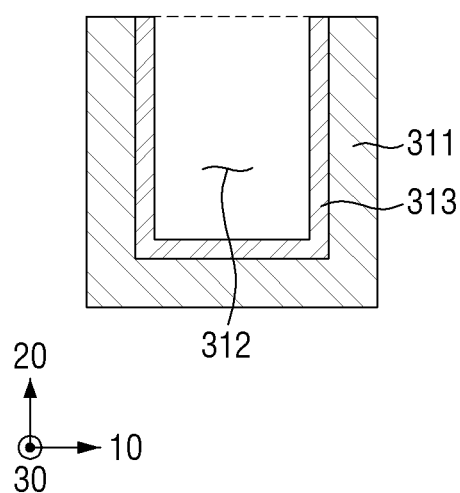

[FIG. 13]
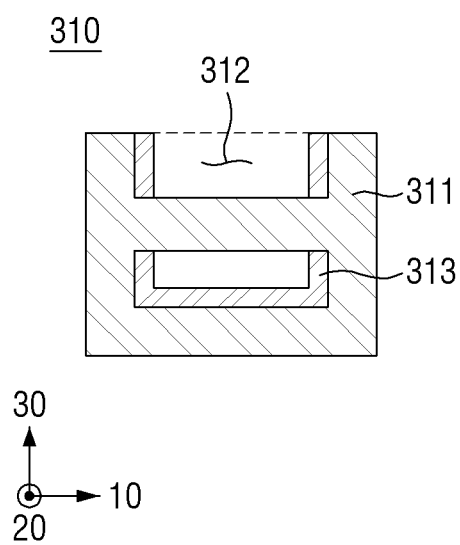

INTERFACE APPARATUS AND CONTAINER TRANSPORTING SYSTEM WITH THE APPARATUS

CROSS REFERENCE TO RELATED APPLICATION

This application claims the benefit of Korean Patent Application No. 10-2020-0146066, filed on Nov. 4, 2020, in the Korean Intellectual Property Office, the disclosure of which is incorporated herein by reference in its entirety.

FIELD OF THE INVENTION

The present invention relates to an interface device and a container transporting system having the same. More particularly, it relates to an interface device applicable to a semiconductor manufacturing facility and a container transporting system having the same.

DESCRIPTION OF THE RELATED ART

The process of manufacturing a semiconductor device may be continuously performed in a semiconductor manufacturing facility, and may be divided into a pre-process and a post-process. A semiconductor manufacturing facility may be installed in a space generally defined as a FAB for manufacturing semiconductor devices.

The pre-process refers to a process of forming a circuit pattern on a wafer to complete a chip. The pre-process may include a deposition process for forming a thin film on a wafer, a photo-lithography process for transferring a photo resist onto a thin film using a photo mask, an etching process for selectively removing unnecessary parts using chemical substances or reactive gases to form a circuit pattern on a wafer, an ashing process for removing the photo resist remaining after etching, an ion implantation process for implanting ions into the portion connected to the circuit pattern to have characteristics of an electronic device, a cleaning process for removing contamination sources from the wafer, and the like.

The post-process refers to the process of evaluating the performance of the product finished through the pre-process. The post-process may include a wafer inspection process that checks whether each chip on the wafer operates and selects good and bad products, a package process that cuts and separates each chip through dicing, die bonding, wire bonding, molding and marking to have the shape of the product, and the final inspection process that finally checks the product characteristics and reliability through electrical property inspection, and burn-in inspection.

SUMMARY OF THE INVENTION

A semiconductor device such as a wafer may be manufactured through various processes in a FAB, in which a semiconductor manufacturing facility is built. At this time, the semiconductor device is accommodated in a FOUP (Front Opening Unified Pod), and may be transported to a facility where each process is performed through an overhead hoist transport (OHT) arranged on the ceiling of the FAB, and may be stored in a stocker.

However, during the interface work between the OHT and the stocker to store the FOUP in the stocker, the OHT stops on the OHT port and moves again after completing the loading/unloading operation. That is, the conventional system required a stop of the OHT during the interface work between the OHT and the stocker, which became a fundamental cause of logistics congestion.

An object to be solved in the present invention is to provide an interface apparatus for resolving congestion through a non-stop interface between a transporting device (OHT) and a logistics automation storage device (stocker) and a container transporting system having the same.

The problems of the present invention are not limited to the problems mentioned above, and other problems not mentioned will be clearly understood by those skilled in the art from the following description.

One aspect of the interface device of the present invention for achieving the above object comprises a saddle for receiving a container from a container transporting device; and a circulating path for providing a route for transporting the container seated on the saddle to a container storage device, wherein the saddle receives the container while moving together with the container transporting device.

Wherein the saddle may move at the same or similar speed as the container transporting device when receiving the container.

Wherein the circulating path may include a first section overlapping a movement path of the container transporting device.

Wherein the saddle may receive the container from the container transporting device in the first section.

Wherein the saddle may move at the same speed as the container transporting device in the first section when the saddle enters the first section at the same time as the container transporting device.

Wherein the saddle may move faster than the container transporting device when the saddle enters the first section later than the container transporting device.

Wherein the saddle may move faster than the container transporting device until the saddle moves while maintaining the same line with the container transporting device in the first section.

Wherein the saddle may be accelerated than the container transporting device, or the container transporting device may be decelerated than the saddle.

Wherein the saddle may move slower than the container transporting device when the saddle enters the first section earlier than the container transporting device.

Wherein the saddle may move slower than the container transporting device until the saddle moves while maintaining the same line with the container transporting device in the first section.

Wherein the saddle may be decelerated than the container transporting device, or the container transporting device may be accelerated than the saddle.

Wherein the saddle may be located on the same line as the container transporting device under the container transporting device when receiving the container.

Wherein a speed of the saddle may be variable when the saddle moves on the circulating path.

Wherein a plurality of saddles are installed on the circulating path, and speeds of the plurality of saddles may be independently controlled.

Wherein the circulating path may comprise a first section, in which the saddle receives the container from the container transporting device; a second section, in which the saddle delivers the container to the container storage device; a third section, in which the saddle transports the container; and a fourth section, in which the saddle moves after delivering the container.

Wherein the saddle may wait in the fourth section.

Wherein the saddle may have a length corresponding to a section receiving the container in the circulating path.

Wherein the saddle may move when receiving the container.

Another aspect of the interface device of the present invention for achieving the above object comprises a saddle for receiving a container from a container transporting device; and a circulating path for providing a route for transporting the container seated on the saddle to a container storage device, wherein the saddle receives the container while moving together with the container transporting device, and moves at the same or similar speed as the container transporting device when receiving the container.

Another aspect of the container transporting system of the present invention for achieving the above object comprises a container transporting device for transporting a container; a container storage device for storing the container; and an interface device for interfacing with the container transporting device and the container storage device, wherein the interface device comprises a saddle for receiving a container from the container transporting device; and a circulating path for providing a route for transporting the container seated on the saddle to the container storage device, wherein the saddle receives the container while moving together with the container transporting device.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 1 is a diagram schematically illustrating an internal configuration of a container transporting system according to an embodiment of the present invention;

FIG. 2 is a diagram schematically illustrating an internal structure of a container storage device constituting a container transporting system according to an embodiment of the present invention;

FIG. 3 is a diagram schematically illustrating an internal structure of an interface device constituting a container transporting system according to an embodiment of the present invention;

FIG. 4 is a first exemplary view for describing the function of a control device constituting a container transporting system according to an embodiment of the present invention;

FIG. 5 is a second exemplary view for describing the function of the control device constituting a container transporting system according to an embodiment of the present invention;

FIG. 6 is an exemplary view for explaining a function of an interface device constituting a container transporting system according to an embodiment of the present invention;

FIG. 7 is a first exemplary diagram for describing an interface method between a container transporting device and an interface device constituting a container transporting system according to an embodiment of the present invention;

FIG. 8 is a second exemplary diagram for describing an interface method between a container transporting device and an interface device constituting a container transporting system according to an embodiment of the present invention;

FIG. 9 is a third exemplary diagram for describing an interface method between a container transporting device and an interface device constituting a container transporting system according to an embodiment of the present invention;

FIG. 10 is a fourth exemplary diagram for describing an interface method between a container transporting device and an interface device constituting a container transporting system according to an embodiment of the present invention;

FIG. 11 is a plan view for describing a first embodiment shape of the saddle constituting the interface device shown in FIG. 3;

FIG. 12 is a plan view for describing a second embodiment shape of the saddle constituting the interface device shown in FIG. 3; and FIG. 13 is a side view for describing various embodiment shapes of the saddle constituting the interface device shown in FIG. 3.

DETAILED DESCRIPTION OF THE INVENTION

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same elements throughout the specification.

When elements or layers are referred to as "on" or "above" of other elements or layers, it includes not only when directly above of the other elements or layers, but also other elements or layers intervened in the middle. On the other hand, when elements are referred to as "directly on" or "directly above," it indicates that no other element or layer is intervened therebetween.

The spatially relative terms "below," "beneath," "lower," "above," "upper," etc., as shown in figures, can be used to easily describe the correlation of components or elements with other components or elements. The spatially relative terms should be understood as terms including the different direction of the element in use or operation in addition to the direction shown in the figure. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various components, elements and/or sections, these components, elements and/or sections are not limited by these terms. These terms are only used to distinguish one component, element, or section from another component, element or section. Therefore, first component, the first element or first section mentioned below may be a second component, second element, or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the elements, steps, operations and/or components mentioned above do not exclude the presence or additions of one or more other elements, steps, operations and/or components.

Unless otherwise defined, all terms (including technical and scientific terms) used in the present description may be used with meanings that can be commonly understood by those of ordinary skill in the art to which the present invention belongs. In addition, terms defined in a commonly used dictionary are not interpreted ideally or excessively unless explicitly defined specifically.

Hereinafter, exemplary embodiments of the present invention will be described in detail with reference to the accompanying drawings, and in the description with reference to the accompanying drawings, the same or corresponding elements are assigned the same reference numbers regardless of reference numerals, and the description overlapped therewith will be omitted.

It takes a lot of time to stop the OHT and raise/lower the FOUP for the interface between the OHT and the stocker, and these problems are causing congestion in the logistics system.

In the present invention, in order to solve the congestion of the logistics automation system, an interface device for implementing a non-stop interface between a transporting device (e.g., OHT) and a logistics automation storage device (e.g., a stocker) and a container transporting system having the same are provided. Hereinafter, the present invention will be described in detail with reference to drawings and the like.

FIG. 1 is a diagram schematically illustrating an internal configuration of a container transporting system according to an embodiment of the present invention.

Referring to FIG. 1, a container transporting system 100 may include a container transporting device 110, a container storage device 120, an interface device 130, and a control device 140.

The container transporting device 110 transports a container to a destination (e.g., the container storage device 120). The container transporting device 110 may be implemented as, for example, an overhead hoist transport (OHT), and the container may be implemented as, for example, a Front Opening Unified Pod (FOUP).

The container transporting device 110 may transport the container by traveling on a rail installed on a ceiling in a FAB (e.g., a clean room), in which a semiconductor manufacturing facility is built. A plurality of container transporting devices 110 may be arranged in the FAB.

The container storage device 120 stores containers. The container storage device 120 may store the container when the container is transported by the container transporting device 110. The container storage device 120 may be implemented as, for example, a stocker.

The container storage device 120 may receive and store the container transported by the container transporting device 110 through the interface device 130. For this purpose, the container storage device 120 may be configured to include a transporting robot 210 and a shelf 220 as shown in FIG. 2.

FIG. 2 is a diagram schematically illustrating an internal structure of a container storage device constituting a container transporting system according to an embodiment of the present invention. The following description refers to FIG. 2.

The transporting robot 210 receives the container from the interface device 130 and loads it on the shelf 220. The transporting robot 210 may travel on the rail 230 to move to a place where a specific shelf (e.g., 220k) is located, and then load the container on the shelf.

In FIG. 2, the rail 230 is shown to extend in the first direction 10, but in this embodiment, the rail 230 may also be formed to be extended in the second direction 20 and the third direction 30 as well as in the first direction 10. Accordingly, the transporting robot 210 may load the container on the shelf 220 after moving in at least one of the first direction 10, the second direction 20, and the third direction 30.

The shelf 220 supports the container when the container is seated thereon by the transporting robot 210. A plurality of shelves 220 (220a, 220b, ..., 220k, ..., 220n) may be installed in the container storage device 120.

A plurality of shelves 220a, 220b, ..., 220k, ..., 220n may be arranged in plurality in the first direction 10 and the second direction 20, respectively. However, the present embodiment is not limited thereto. A plurality of shelves 220a, 220b, ..., 220k, ..., 220n may also be arranged in a plurality in the third direction 30. On the other hand, the plurality of shelves 220a, 220b, ..., 220k, ..., 220n may also be arranged in a plurality in any one of the first direction 10, the second direction 20, and the third direction 30.

It will be described again with reference to FIG. 1.

The interface device 130 interfaces with the container transporting device 110 and the container storage device 120. The interface device 130 may deliver the container to the container storage device 120 through the interface with the container storage device 120 after receiving the container from the container transporting device 110 through the interface with the container transporting device 110.

The interface device 130 may deliver a container from the container transporting device 110 to the container storage device 120 while circulating around the container transporting device 110 and the container storage device 120 along a predetermined path.

FIG. 3 is a diagram schematically illustrating an internal structure of an interface device constituting a container transporting system according to an embodiment of the present invention.

Referring to FIG. 3, the interface device 130 may include a saddle 310 and a circulating path 320.

The container is seated on the saddle 310 when interfacing with the container transporting device 110. The saddle 310 may move along the circulating path 320 to deliver the container seated thereon to the container storage device 120.

At least one saddle 310 may be installed on the circulating path 320. These saddles 310 may move at a variable speed in each section on the circulating path 320.

Also, the saddle 310 may move at a different speed in each section on the circulating path 320. However, the present embodiment is not limited thereto. It is also possible for the saddle 310 to move at the same speed in each section on the circulating path 320.

On the other hand, it is also possible that the saddle 310 moves at the same speed in several sections on the circulating path 320, and moves at different speeds in several other sections on the circulating path 320.

Meanwhile, when a plurality of saddles 310 are installed on the circulating path 320, the speed of each saddle 310 may be independently controlled.

For example, when three saddles 310 are installed on the circulating path 320, as shown in FIG. 4, the first saddle 310a may move at a first speed V1 on the circulating path 320, the second saddle 310b may move at a second speed V2 on the circulating path 320, and the third saddle 310c may move at a third speed V3 on the circulating path 330. FIG. 4 is a first exemplary view for describing the function of a control device constituting a container transporting system according to an embodiment of the present invention.

However, the present embodiment is not limited thereto. As shown in FIG. 5, it is also possible that the first saddle 310a and the second saddle 310b move at a first speed V1 on the circulating path 320, and the third saddle 310c moves at a second speed V2 on the circulating path 330. FIG. 5 is a second exemplary view for describing the function of the control device constituting the container transporting system according to an embodiment of the present invention.

Independently controlling the speeds of the plurality of saddles 310 may be performed by the control device 140 in the present embodiment.

It will be described again with reference to FIG. 3.

The circulating path 320 is to provide a route for transporting the container to the container storage device 120. The transporting path 320 may be divided into a plurality of sections. The circulating path 320 may be divided into, for example, four sections, that is, a first section 321, a second section 322, a third section 323, and a fourth section 324.

FIG. 6 is an exemplary view for describing a function of an interface device constituting a container transporting system according to an embodiment of the present invention. The following description refers to FIG. 6.

The first section 321 is a partial section located on one side of the circulating path 320 of the interface device 130. The first section 321 may overlap the movement path 330 of the container transporting device 110.

The first section 321 may be arranged below the movement path 330 of the container transporting device 110. Accordingly, the first section 321 and the movement path 330 of the container transporting device 110 may overlap in the vertical direction (the third direction 30).

The interface device 130 may interface with the container transporting device 110 in the first section 321. The interface device 130 may receive the container from the container transporting device 110 through the interface in the first section 321.

The second section 322 is a partial section located on the other side of the circulating path 320 of the interface device 130. The second section 322 may overlap the movement path 340 of the container storage device 120 (specifically, the transporting robot 210).

The second section 322 may be arranged on the side portion of the movement path 340 of the container storage device 120. Accordingly, the second section 322 and the movement path 340 of the container storage device 120 may overlap in the lateral direction (the first direction 10 or the second direction 20).

The interface device 130 may interface with the container storage device 120 in the second section 322. The interface device 130 may deliver the container to the container storage device 120 through the interface in the second section 322.

Next, an interface between the container transporting device 110 and the interface device 130 will be described.

FIG. 7 is a first exemplary diagram for describing an interface method between a container transporting device and an interface device constituting a container transporting system according to an embodiment of the present invention. The following description refers to FIG. 7.

As described above, the container transporting device 110 and the interface device 130 (specifically, the saddle 310) may interface in the first section 321, wherein the container 410 may be delivered to the interface device 130 from the container transporting device 110.

When delivering the container 410 to the interface device 130, the container transporting device 110 may deliver the container 410 to the interface device 130 while continuously moving without stopping. To this end, the interface device 130 may move at the same speed (i.e., V1) as the speed V1 of the container transporting device 110. At this time, it is also possible for the interface device 130 to move at a speed similar to the speed V1 of the container transporting device 110 within an error range.

In this embodiment, since the container transporting device 110 and the interface device 130 can deliver the container 410 while moving in this way, it is possible to obtain an effect of resolving the congestion phenomenon of the logistics automation system.

Meanwhile, the interface device 130 may wait in the fourth section 324 to interface with the container transporting device 110 in the first section 321. In this case, the interface device 130 may move at a low speed or temporarily stop in the fourth section 324.

Meanwhile, when the container transporting device 110 and the interface device 130 are located on the same line in the third direction 30 when the container transporting device 110 and the interface device 130 enter the first section 321, the interface device 130 may normally receive the container 410 from the container transporting device 110 if the interface device 130 moves at the same speed as the container transporting device 110.

On the other hand, when the container transporting device 110 and the interface device 130 are not located on the same line in the third direction 30 when the container transporting device 110 and the interface device 130 enter the first section 321, the interface device 130 cannot normally receive the container from the container transporting device 110.

Hereinafter, a solution to this problem will be described. First, a case, in which the container transporting device 110 enters the first section 321 later than the interface device 130, will be described.

FIG. 8 is a second exemplary diagram for describing an interface method between a container transporting device and an interface device constituting a container transporting system according to an embodiment of the present invention. The following description refers to FIG. 8.

When the container transporting device 110 enters the first section 321, the container transporting device 110 may elevate the container 410 to deliver the container 410 to the interface device 130. However, when the container transporting device 110 enters the first section 321 later than the interface device 130, the container transporting device 110 should move at the speed V2 that is faster than the speed V1 of the interface device 130 during a predetermined section (where, V2>V1) in order to normally deliver the container 410 to the interface device 130 before the container transporting device 110 passes through the first section 321.

The control device 140 may receive information on the current position in real time from the container transporting device 110 and the interface device 130, and from this, control the container transporting device 110 to move at a faster speed than the interface device 130 so that the container 410 is normally delivered to the interface device 130 before the container transporting device 110 passes through the first section 321 even if the container transporting device 110 enters the first section 321 later than the interface device 130.

Next, a case, in which the container transporting device 110 enters the first section 321 earlier than the interface device 130, will be described.

FIG. 9 is a third exemplary diagram for describing an interface method between a container transporting device and an interface device constituting a container transporting system according to an embodiment of the present invention. The following description refers to FIG. 9.

When the container transporting device 110 enters the first section 321 earlier than the interface device 130, the container transporting device 110 should move at a speed V3 that is slower than the speed V1 of the interface device 130 during a predetermined section (where, V3<V1) in order to normally deliver the container 410 to the interface device 130 before the container transporting device 110 passes through the first section 321.

The control device 140 may receive information on the current position in real time from the container transporting device 110 and the interface device 130, and from this, control the container transport device 110 to move at a slower speed than the interface device 130 so that the container 410 is normally delivered to the interface device 130 before the container transporting device passes through the first section 321 even if the container transporting device 110 enters the first section 321 earlier than the interface device 130.

Meanwhile, in FIGS. 8 and 9, a method of controlling the speed of the container transporting device 110 to allow the container transporting device 110 and the interface device 130 to move along the same line in the third direction 30 in the first section 321 has been described.

However, the present embodiment is not limited thereto. In this embodiment, it is also possible to control the speed of the interface device 130 to allow the container transporting device 110 and the interface device 130 to move along the same line in the third direction 30 in the first section 321.

For example, as shown in FIG. 8, when the container transporting device 110 enters the first section 321 later than the interface device 130, the control device 140 may control the interface device 130 to move at a slower speed than the container transporting device 110 during a predetermined section.

In addition, as shown in FIG. 9, when the container transporting device 110 enters the first section 321 earlier than the interface device 130, the control device 140 may control the interface device 130 to move at a faster speed than the container transporting device 110 during a predetermined section.

Meanwhile, in the present embodiment, it is also possible to configure the saddle 310 to have a length corresponding to the length of the first section 321 as shown in FIG. 10. In this case, the saddle 310 waits after entering the first section 321, and when receiving the container 410 from the container transporting device 110, the saddle 310 may move to the second section 322 to deliver the container 410 to the container storage device 120.

In the present embodiment, even in such a case, the container transporting device 110 may deliver the container 410 to the interface device 130 while continuously moving without stopping, thereby obtaining an effect of resolving the congestion phenomenon of the logistics automation system. FIG. 10 is a fourth exemplary diagram for describing an interface method between a container transporting device and an interface device constituting a container transporting system according to an embodiment of the present invention.

Meanwhile, the interface device 130 may be formed to have a concave shape (凹) to prevent the container 410 from falling while the container 410 is transported to the container storage device 120. Hereinafter, this will be described.

FIG. 11 is a plan view for describing a first embodiment shape of the saddle constituting the interface device shown in FIG. 3, FIG. 12 is a plan view for describing a second embodiment shape of the saddle constituting the interface device shown in FIG. 3, and FIG. 13 is a side view for describing various embodiment shapes of the saddles constituting the interface device shown in FIG. 3. The following description refers to FIGS. 11 to 13.

The body 311 of the saddle 310 may have a concave shape, (i.e., 凵 shape), in which a groove 312 is formed in a downward direction (third direction 30) from an upper portion thereof. When the body 311 of the saddle 310 is formed to have such a shape, it becomes possible to stably transport the container 410 seated in the groove 312 to the container storage device 120.

The body 311 of the saddle 310 may be formed such that its circumference is all sealed around the groove 312. The body 311 of the saddle 310 may be formed such that sidewalls are formed in all directions around the groove 312, for example, as shown in FIG. 11.

However, the present embodiment is not limited thereto. It is also possible that the body 311 of the saddle 310 is formed so that the circumference thereof is not all sealed around the groove 312. The body 311 of the saddle 310 may be formed such that, for example, a sidewall is not formed on at least one side around the groove 312 as shown in FIG. 12.

On the other hand, the sidewall formed on the side surface of the body 311 of the saddle 310 may be formed to be partially open as shown in FIG. 13.

The container 410 may be seated in the groove 312 formed in the body 311 of the saddle 310. However, when the container 410 is seated in the groove 312, an impact may be applied to the substrate embedded in the container 410. In the present embodiment, an impact absorbing member 313 may be provided on the inner side surface (or inner circumferential surface) of the groove 312 in order to solve this problem. The impact absorbing member 313 may be implemented as, for example, an anti-impact pad.

It will be described again with reference to FIG. 1.

The control device 140 controls the operation of the container transporting device 110, the container storage device 120, and the interface device 130. The control device 140 may be implemented as a device including a processor having an arithmetic function and a control function, a memory having a storage function, a power supply having a power supply function, and the like. The control device 140 may be implemented as, for example, a computer or a server.

The container transporting system 100 has been described above with reference to FIGS. 1 to 13. The container transporting system 100 is to fundamentally remove the logistics congestion factor through the non-stop interface between the OHT (container transporting device 110) and the stocker (container storage device 120). The characteristics of such a container transporting system 100 are summarized as follows.

First, a module (interface device 130) that moves in the same direction as the OHT is configured in the OHT PORT unit.

Second, a system to control the speed of OHT and OHT PORT synchronously is established. In addition, each module is controlled to operate independently. In the present embodiment, the control device 140 may perform such a function.

Third, the anti-impact pad that can minimize an impact when the FOUP (container 410) is seated, that is, an impact absorbing device (impact absorbing member 313) that can prevent an impact when the FOUP is seated on the OHT PORT is configured. The anti-impact pad serves a FOUP impact absorbing and guide function.

According to the present invention, when performing the interface work between the OHT and the stocker, the OHT can work without stopping so that the entire logistics system can be efficiently configured. The container transporting system 100 described above may be applied to a logistics automation system of a semiconductor manufacturing facility.

Although the embodiments of the present invention have been described with reference to the above and the accompanying drawings, those of ordinary skill in the art to which the present invention pertains can understand that the present invention can be practiced in other specific forms without changing its technical spirit or essential features. Therefore, it should be understood that the embodiments described above are illustrative in all respects and not limiting.

What is claimed is:

1. An interface apparatus comprising:
   a plurality of saddles for receiving containers from a container transporting device, each of the plurality of saddles comprising a body and a groove formed in a surface of the body configured to face the container transporting device, the groove at least partially surrounded by sidewalls, and an impact absorbing member being formed on one or more surfaces of the groove;
   a circulating path for providing a route for transporting the containers seated on saddles to a container storage device; and
   a control device configured to control speeds of the plurality of saddles on the circulating path,
   wherein each saddle of the plurality of saddles receives in a respective groove thereof a respective container of the containers while moving together with the container transporting device, each saddle receiving the respective container on the one or more surfaces of the respective groove having the impact absorbing member, and
   wherein the control device independently controls the speeds of the plurality of saddles relative to one another, such that a speed of one of the plurality of saddles may be different from a speed of another of the plurality of saddles.

2. The apparatus of claim 1, wherein each saddle moves at the same or similar speed as the container transporting device when receiving the respective container.

3. The apparatus of claim 1, wherein the circulating path includes a first section overlapping a movement path of the container transporting device.

4. The apparatus of claim 3, wherein each saddle receives the respective container from the container transporting device in the first section.

5. The apparatus of claim 4, wherein each saddle moves at the same speed as the container transporting device in the first section when the saddle enters the first section at the same time as the container transporting device.

6. The apparatus of claim 4, wherein each saddle moves faster than the container transporting device when the saddle enters the first section later than the container transporting device.

7. The apparatus of claim 6, wherein each saddle moves faster than the container transporting device until the saddle moves while maintaining the same line with the container transporting device in the first section.

8. The apparatus of claim 7, wherein the saddle is accelerated relative to the container transporting device, or the container transporting device is decelerated relative to the saddle.

9. The apparatus of claim 4, wherein each saddle moves slower than the container transporting device when the saddle enters the first section earlier than the container transporting device.

10. The apparatus of claim 9, wherein each saddle moves slower than the container transporting device until the saddle moves while maintaining the same line with the container transporting device in the first section.

11. The apparatus of claim 10, wherein each saddle is decelerated relative to the container transporting device, or the container transporting device is accelerated relative to the saddle.

12. The apparatus of claim 1, wherein each saddle is located on the same line as the container transporting device under the container transporting device when receiving the container.

13. The apparatus of claim 1, wherein the circulating path comprises:
    a first section, in which the saddle receives the container from the container transporting device;
    a second section, in which the saddle delivers the container to the container storage device;
    a third section, in which the saddle transports the container; and
    a fourth section, in which the saddle moves after delivering the container.

14. The apparatus of claim 13, wherein the saddle waits in the fourth section.

15. The apparatus of claim 1, wherein each saddle has a length corresponding to a section receiving the respective container in the circulating path.

16. The apparatus of claim 15, wherein each saddle moves when receiving the respective container.

17. The apparatus of claim 1, wherein the control device receives real time position information for the container transporting device and the plurality of saddles, and independently controls the speeds of the plurality of saddles based on the real time position information, or
    wherein the independent control of the plurality of saddles relative to one another includes temporarily stopping one of the plurality of saddles relative to another one of the plurality of saddles in one section of the circulating path.

18. The apparatus of claim 1,
    wherein the groove is surrounded by sidewalls on fewer than all sides of the groove.

19. An interface apparatus comprising:
    a plurality of saddles for receiving containers from a container transporting device, each of the plurality of saddles comprising a body and a groove formed in a surface of the body configured to face the container transporting device, the groove at least partially surrounded by sidewalls, and an impact absorbing member being formed on one or more surfaces of the groove;

a circulating path for providing a route for transporting the containers seated on saddles to a container storage device; and a control device configured to control speeds of the plurality of saddles on the circulating path, wherein each saddle of the plurality of saddles receives in a respective groove thereof a respective container of the containers while moving together with the container transporting device, each saddle receiving the respective container on the one or more surfaces of the respective groove having the impact absorbing member, and moves at the same or similar speed as the container transporting device when receiving the container, and wherein the control device independently controls the speeds of the plurality of saddles relative to one another, such that a speed of one of the plurality of saddles may be different from a speed of another of the plurality of saddles.

20. A container transporting system comprising:

a container transporting device for transporting a container;

a container storage device for storing the container; and an interface device for interfacing with the container transporting device and the container storage device, wherein the interface device comprises, a plurality of saddles for receiving containers from the container transporting device, each of the plurality of saddles comprising a body and a groove formed in a surface of the body configured to face the container transporting device, the groove at least partially surrounded by sidewalls, and an impact absorbing member being formed on one or more surfaces of the groove;

a circulating path for providing a route for transporting the containers seated on the saddles to the container storage device; and a control device configured to control speeds of the plurality of saddles on the circulating path, wherein each saddle of the plurality of saddles receives in a respective groove thereof a respective container of the containers while moving together with the container transporting device, each saddle receiving the respective container on the one or more surfaces of the respective groove having the impact absorbing member, and wherein the control device independently controls the speeds of the plurality of saddles relative to one another, such that a speed of one of the plurality of saddles may be different from a speed of another of the plurality of saddles.

* * * * *